US009474150B2

United States Patent
Cherif

(10) Patent No.: US 9,474,150 B2
(45) Date of Patent: Oct. 18, 2016

(54) TRANSMISSION LINE FILTER WITH TUNABLE CAPACITOR

(71) Applicant: TDK Corporation, Tokyo (JP)

(72) Inventor: Bouchaib Cherif, Yorktown Heights, NY (US)

(73) Assignee: TDK Corporation, Tokyo (JP)

(*) Notice: Subject to any disclaimer, the term of this patent is extended or adjusted under 35 U.S.C. 154(b) by 169 days.

(21) Appl. No.: 14/264,756

(22) Filed: Apr. 29, 2014

(65) Prior Publication Data

US 2015/0162886 A1  Jun. 11, 2015

Related U.S. Application Data

(63) Continuation-in-part of application No. 14/101,833, filed on Dec. 10, 2013.

(51) Int. Cl.
| | |
|---|---|
| *H01G 5/14* | (2006.01) |
| *H05K 1/02* | (2006.01) |
| *H05K 1/16* | (2006.01) |
| *H01G 5/16* | (2006.01) |
| *H01G 5/18* | (2006.01) |
| *H01P 1/203* | (2006.01) |

(52) U.S. Cl.
CPC .............. *H05K 1/0292* (2013.01); *H01G 5/14* (2013.01); *H05K 1/16* (2013.01); *H01G 5/16* (2013.01); *H01G 5/18* (2013.01); *H01P 1/20336* (2013.01); *H05K 1/024* (2013.01); *H05K 1/025* (2013.01); *H05K 1/162* (2013.01); *H05K 2201/09727* (2013.01); *H05K 2201/09781* (2013.01); *H05K 2203/171* (2013.01)

(58) Field of Classification Search
None
See application file for complete search history.

(56) References Cited

U.S. PATENT DOCUMENTS

| | | |
|---|---|---|
| 6,242,989 B1 | 6/2001 | Barber et al. |
| 6,529,750 B1 | 3/2003 | Zhang et al. |
| 6,792,299 B2 | 9/2004 | Ye |
| 7,006,342 B2 | 2/2006 | Williams et al. |
| 8,189,319 B2 | 5/2012 | Kawakubo et al. |
| 8,237,519 B2 | 8/2012 | Achour |
| 2002/0025595 A1 | 2/2002 | Xu et al. |
| 2002/0074621 A1 | 6/2002 | Cheng et al. |
| 2002/0075626 A1 | 6/2002 | Liu et al. |
| 2002/0079743 A1 | 6/2002 | Ma et al. |
| 2004/0036132 A1 | 2/2004 | de los Santos |
| 2004/0150939 A1 | 8/2004 | Huff |
| 2004/0173876 A1 | 9/2004 | Musalem et al. |

(Continued)

OTHER PUBLICATIONS

Goldsmith et al., "RF MEMs Variable Capacitors for Tunable Filters," Raytheon Systems Corporation, Dallas, TX, received Jul. 27, 1998, revised Dec. 30, 1998, 1999 John Wiley & Sons, Inc., 13 pages.

(Continued)

*Primary Examiner* — Dion R Ferguson
(74) *Attorney, Agent, or Firm* — Nixon Peabody LLP

(57) ABSTRACT

A tunable filter design. The filter is implemented using transmission line sections as inductive and capacitive components. At least one capacitive component is a tunable capacitor. In some implementations, the tunable capacitor may be an interdigitated array of finger elements arranged so that the spacing between fingers may be adjusted. The design has a number of advantages including high capacitance for a given circuit area, small area for a given desired capacitance, mechanical stability, high self resonance frequency, and high quality factor.

8 Claims, 9 Drawing Sheets

(56) References Cited

U.S. PATENT DOCUMENTS

| | | |
|---|---|---|
| 2004/0190217 A1 | 9/2004 | Stokes |
| 2004/0246654 A1 | 12/2004 | Williams et al. |
| 2005/0224916 A1 | 10/2005 | Musalem et al. |
| 2006/0291134 A1 | 12/2006 | Plowman et al. |
| 2006/0291135 A1 | 12/2006 | Musalem et al. |
| 2007/0222462 A1 | 9/2007 | Gardner et al. |
| 2008/0055815 A1 | 3/2008 | Rottenberg |
| 2009/0002915 A1* | 1/2009 | Ayazi .................... H01G 5/145 361/287 |
| 2009/0066299 A1 | 3/2009 | Suzuki |
| 2009/0190284 A1 | 7/2009 | Konishi et al. |
| 2009/0296308 A1 | 12/2009 | Kawakubu et al. |
| 2010/0038753 A1 | 2/2010 | Ni |
| 2010/0214716 A1 | 8/2010 | Liu et al. |
| 2011/0063042 A1 | 3/2011 | Mendolia et al. |
| 2012/0068672 A1 | 3/2012 | Suzuki |
| 2012/0250130 A1 | 10/2012 | Naono |
| 2013/0063857 A1 | 3/2013 | Kim et al. |
| 2013/0135785 A1 | 5/2013 | Kim et al. |
| 2013/0271805 A1 | 10/2013 | Konishi et al. |
| 2015/0162135 A1 | 6/2015 | Cherif |

OTHER PUBLICATIONS

Mohra et al., "Tunable bandpass filter based on capacitor-loaded metamaterial lines," Electronic Letteres $23^{rd}$ Apr. 2009, vol. 45, No. 9, 2 pages.

Saha et al., "Tunable Bandpass Filter using RF MEMs Capacitance and Transmission Line," Progress in Electromagnetics Research C, vol. 23, 233-247, 2011.

Office Action in U.S. Appl. No. 14/101,833, mailed Oct. 2, 2015.

Office Action in U.S. Appl. No. 14/245,033, mailed Nov. 5, 2015.

Notice of Allowance in U.S. Appl. No. 14/101,833, mailed May 16, 2016.

Notice of Allowance in U.S. Appl. No. 14/245,033, mailed Apr. 19, 2016.

* cited by examiner

TRANSMISSION LINE FILTER WITH TUNABLE CAPACITOR

CROSS-REFERENCE TO RELATED APPLICATIONS

This patent application is a continuation-in-part of co-pending U.S. patent application Ser. No. 14/101,833 filed Dec. 10, 2013 entitled "Piezo Controlled Variable Capacitor", and is related to co-pending U.S. patent application Ser. No. 14/218,281 filed Mar. 18, 2014 entitled "Tunable Filter Using Variable Impedance Transmission Lines", and co-pending U.S. patent application Ser. No. 14/245,033 filed Apr. 4, 2014 entitled "Tunable Interdigitated Capacitor", each of which are hereby incorporated by reference in their entirety.

BACKGROUND

1. Technical Field

This patent application relates to radio frequency and microwave frequency filters and in particular to a tunable filter using transmission line elements and one or more shunt capacitors. In one implementation, the shunt capacitors may be implemented as a multi-finger mechanically tunable structure.

2. Background Information

Electronic devices such as smart phones, tablets, laptop computers, and the like are now typically expected to communicate using many different communication protocols that operate over a wide range of radio and microwave frequencies. At the same time these devices need to be a small and inexpensive as possible. The ability to accurately filter signals containing unwanted frequencies becomes a critical aspect of designing these products.

Filters may be classed based on how they treat the input signal. In a low pass filter, high frequencies in the input signal are attenuated, and the filter has little attenuation below the so-called cutoff frequency. Other filter classes include band pass, high pass, band stop and pass band. There are also other design considerations for filters, with their frequency responses depending upon design topology, the order of the filter, and other considerations.

A passive filter is a circuit having a topology that includes only passive components such as inductors, capacitors, and resistors. Passive filters are typically built from two port networks or sections. Multiple sections may be connected in a cascade or daisy-chain consisting of either repeats of the same section or completely different sections. The topology may involve L-sections, T sections, Pi-sections, C sections; each section providing a either unbalanced or balance configuration. Ladder networks may also be used.

SUMMARY

While it is known that certain types of transmission lines may use metamaterial techniques to build compact wideband filters and other electromagnetic devices, these approaches tend to use adjustable resonant components such as varactors to implement tuning.

An improvement in tunable filters is now possible using transmission line sections to synthesize each element of a lumped element filter. For example, one or more capacitors and/or inductors of the filter may be implemented with a transmission line section. The transmission line sections are typically formed on a printed circuit board and then coupled in a circuit according to the desired filter class and topology.

In specific arrangements described herein, at least portion of the filter circuit includes a variable shunt capacitor.

In one implementation, the shunt capacitor element may be formed as a interdigitated structure that includes a first terminal having a main body with fingers extending from the main body, and a second terminal including a second body with fingers extending from that second body. The fingers of the first and second terminal sections are interposed between one another. Tunability of the bandpass filter is then obtained by mechanically adjusting a relative spacing between the fingers of the first and second terminal sections. This movement may be obtained via a motor and/or piezoelectric actuator or in other ways.

In certain embodiments, the fingers of the two terminal sections are arranged in a array having for example at least two rows of fingers disposed in alignment with one another. Spacing is provided between both the vertical and lateral side surfaces of the fingers of the respective terminals to further increase the capacitance available in a given physical space.

BRIEF DESCRIPTION OF THE DRAWINGS

The detailed description below refers to the accompanying drawings, of which.

DETAILED DESCRIPTION OF AN ILLUSTRATIVE EMBODIMENT

Figure 1A:
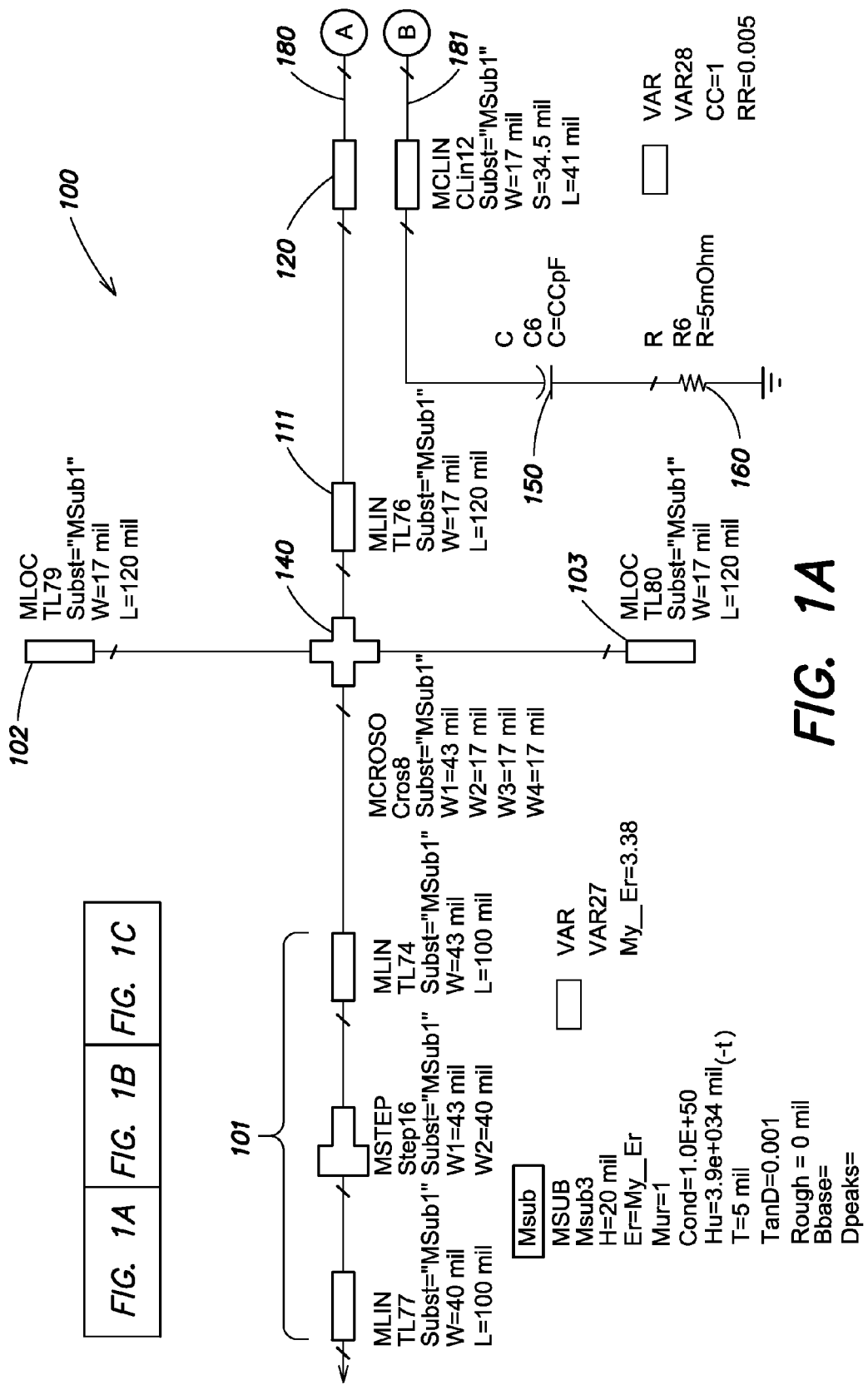
FIGS. 1A, 1B and 1C viewed together are a schematic diagram of a bandpass filter implementation using tunable shunt capacitors.

In preferred implementations herein, a tunable microwave frequency filter is provided using a variable shunt capacitance. The filter includes lumped impedance elements implemented using transmission line sections. A first transmission line section may be used to synthesize a capacitor, and a second transmission line section may be used to synthesize an inductor.

The topology of the filter also includes at least one variable shunt capacitor. The shunt capacitor may be implemented using an interdigitated capacitor structure. In one example, the interdigitated capacitor includes two sets of opposing fingers. The shunt capacitance may then be varied by changing a relative distance between the two sets of fingers.

As described in more detail below, transmission line sections may be used to synthesize one or more discrete elements in a lumped element filter. For example, a first line section may be used to synthesize a capacitor, and a second transmission line section may be used to synthesize an inductor. In one implementation, the transmission line sections may be fabricated as conductive tracks on a printed circuit board, with the printed circuit board having one or more dielectric layers separating the conductive tracks.

The filters may be any desired topology, class or type such as low pass, bandpass, band stop, high pass or the like.

More particularly now, distributed element filters can be obtained by using multiple transmission line sections. When terminated by a load impedance, $Z_L$, a transmission line with characteristic impedance $Z_0$ has an input impedance $Z_{in}$ defined by the following equation:

$$Z_{in} = Z_o \frac{(Z_L + jZ_o \tan\theta)}{(Z_L - jZ_o \tan\theta)}$$

where $\theta$ is the electrical length of the transmission line section.

It is observed that:

For transmission line sections implemented on a printed circuit board (PCB), $$\theta = \frac{2\pi * freq * \sqrt{Er}}{c} * L$$

where Er is the dielectric constant of a material layer disposed between a conductive strip and a ground plane, freq is the operating frequency, "C" is the speed of light, and L is the physical length of the transmission line section.

If $Z_L = 0$ then $Z_{in} = jZ_0 * \tan\theta$; thus a shortened line shares the same input impedance characteristic as an inductor ($Z_{in} = j\omega * ind$)

If $Z_L = \infty$ then $$Z_{in} = \frac{z_0}{j\tan\theta};$$

thus an open line behaves like a capacitor.

From the above derivations, it is understood that capacitors and inductors having different impedances can be synthesized with transmission line sections having different dimensions. That is, different values of capacitance $$\left(Z_{in} = \frac{z_0}{j\tan\theta}\right)$$

and inductance ($Z_{in} = jZ_0 * \tan\theta$) can be synthesized with respective transmission line sections of different sizes, since $$\theta = \frac{2\pi * freq * \sqrt{Er}}{c} * L,$$

where L is the length of the variable Er section and l results in a corresponding change in $Z_{in}$ of a capacitor and inductor. Whether a given length of transmission line operates as an inductor or capacitor depends primarily on L. If $L < \lambda/4$, then the transmission line section is primarily capacitive, if $L > \lambda/4$, then it becomes primarily inductive. The ultimate impedance presented also depends on other dimensions of the transmission line section, such as width, W.

Most any filter topology can therefore be built using inductors and capacitors implemented with transmission line sections configured in this way.

Figure 1B:
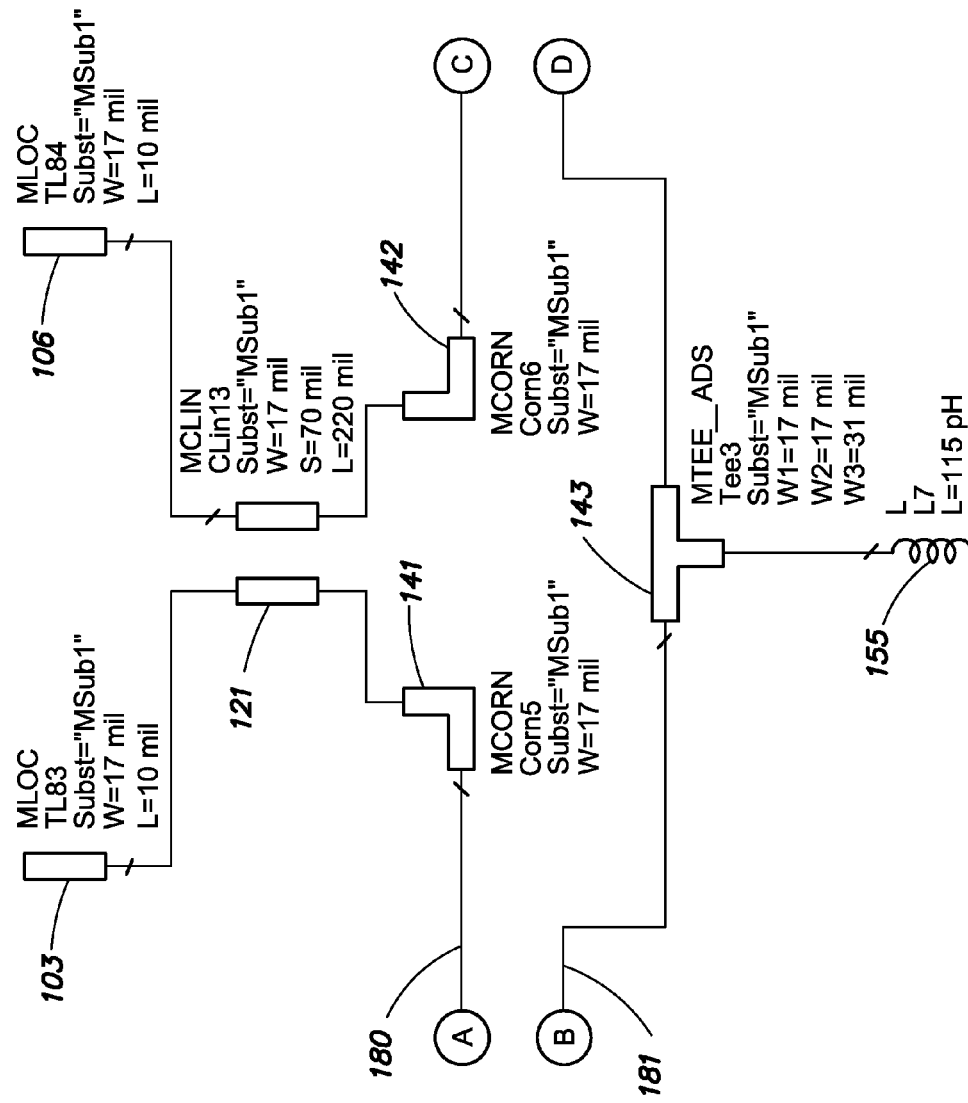
Figure 1C:
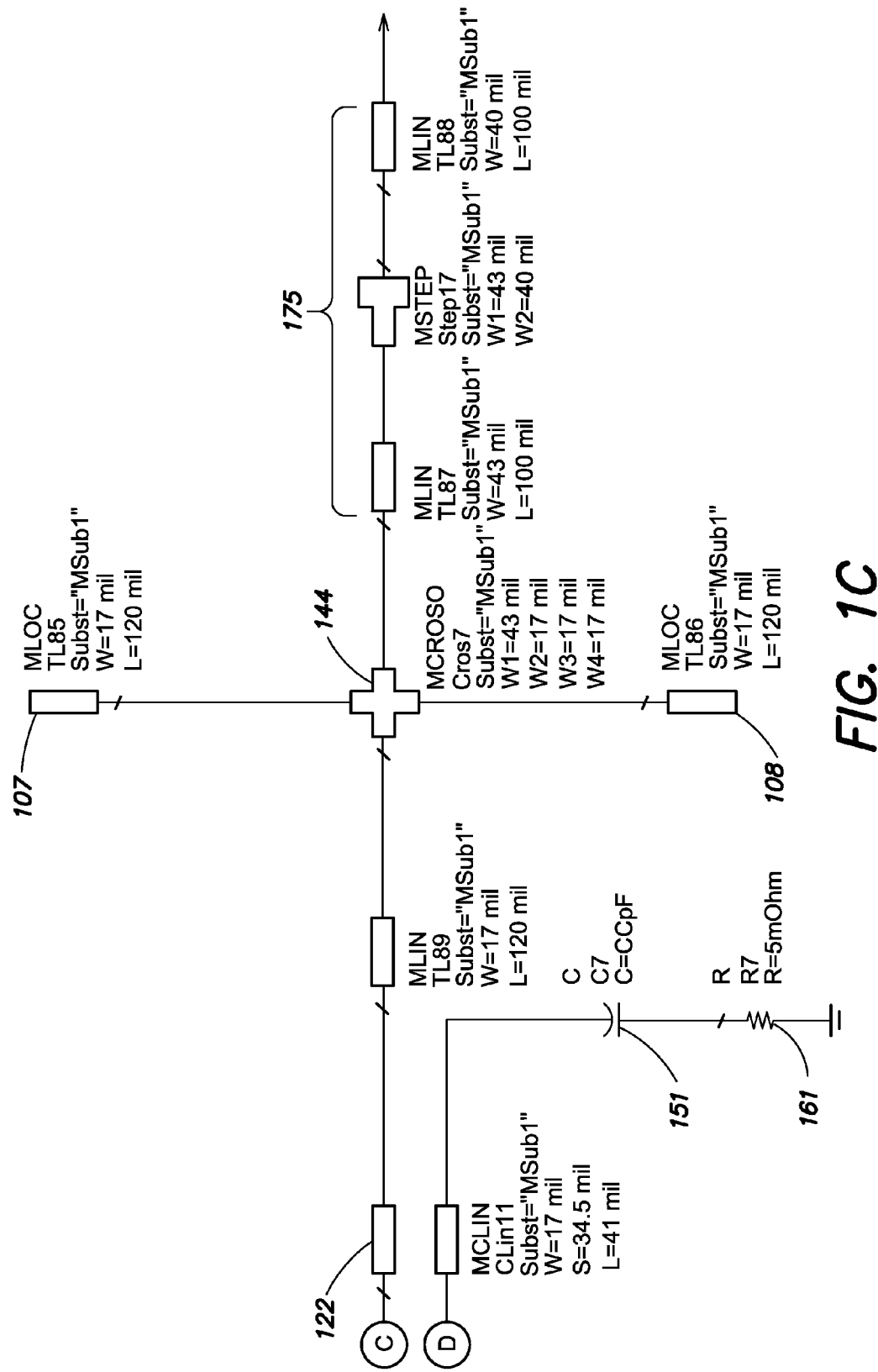

FIGS. 1A, 1B and 1C are a schematic of one possible implementation of such a filter. The topology here is a bandpass filter (BPF) 100, although those of skill in the art will appreciate that other filter types and topologies are possible. Filter 100 makes use of lumped elements implemented as transmission line sections. For example, transmission line sections 120, 121, 122 implement capacitors; and transmission line sections 111, 112 implement inductors. Also shown are other sections of transmission line such as corner sections 141, 142, T section 143, and junctions 140, 144 providing interconnections between the different components of the bandpass filter 100. Transmission line sections 101 may implement input impedance matching and sections 175 implement output impedance matching.

In addition, discrete adjustable shunt capacitors 150, 151 are implemented in the filter 100. In one implementation, these adjustable shunt capacitors may be implemented using an interdigitated structure as described more fully below. The filter 100 may also s include other discrete components such as resistors 160, 161 and/or inductors 155 to complete the filter design.

The transmission line sections implementing the capacitors 120, . . . , 122 and inductors 111, 112 may be implemented using one or more conductive strips disposed on a printed circuit board (PCB) or other dielectric and a ground plane.

The characteristics of the individual transmission line sections are written next to each respective element. For example in the case of inductor 111, the W parameter indicates its width (17 mil) and the L parameter its length (120 mils). For the example capacitor 120, the W parameter indicates its width (17 mils), the L indicates its length (41 mil) and S the spacing between the two sections (34.5 mils).

An example junction 140 is a four port transmission line section that has widths W1, W2, W3, W4 clockwise from the topmost leg section (43, 17, 17 and 17 mils). The widths of the transmission line sections making up an example three port T section 143 are also shown as W1, W2, W3 (17, 17, and 31 mils).

Although not shown in detail in FIG. 1, transmission line section 101, 103, . . . 117, 120, 121, 122, . . . etc. are implemented with a length of metallic conductor line disposed over a dielectric substrate layer. Suitable dielectric materials may include Barium Strontium Titanate (BST) although other materials are possible.

The legend to the bottom left of FIG. 1A lists a number of parameters for a microstrip substrate implementation (MSub1), including substrate height (H), dielectric constant (Er), relative permeability (Mur), conductor conductivity (Cond), cover height (Hu), conductor thickness (T), dielectric loss tangent (TanD) and surface roughness (Rough).

The dielectric layer may, in some implementations, have a variable dielectric wave propagation constant Er. In such an instance, the dielectric constant may be controlled, for example, by applying a voltage across it. Such an implementation may allow fine-tuning of the filter response.

Figure 2:
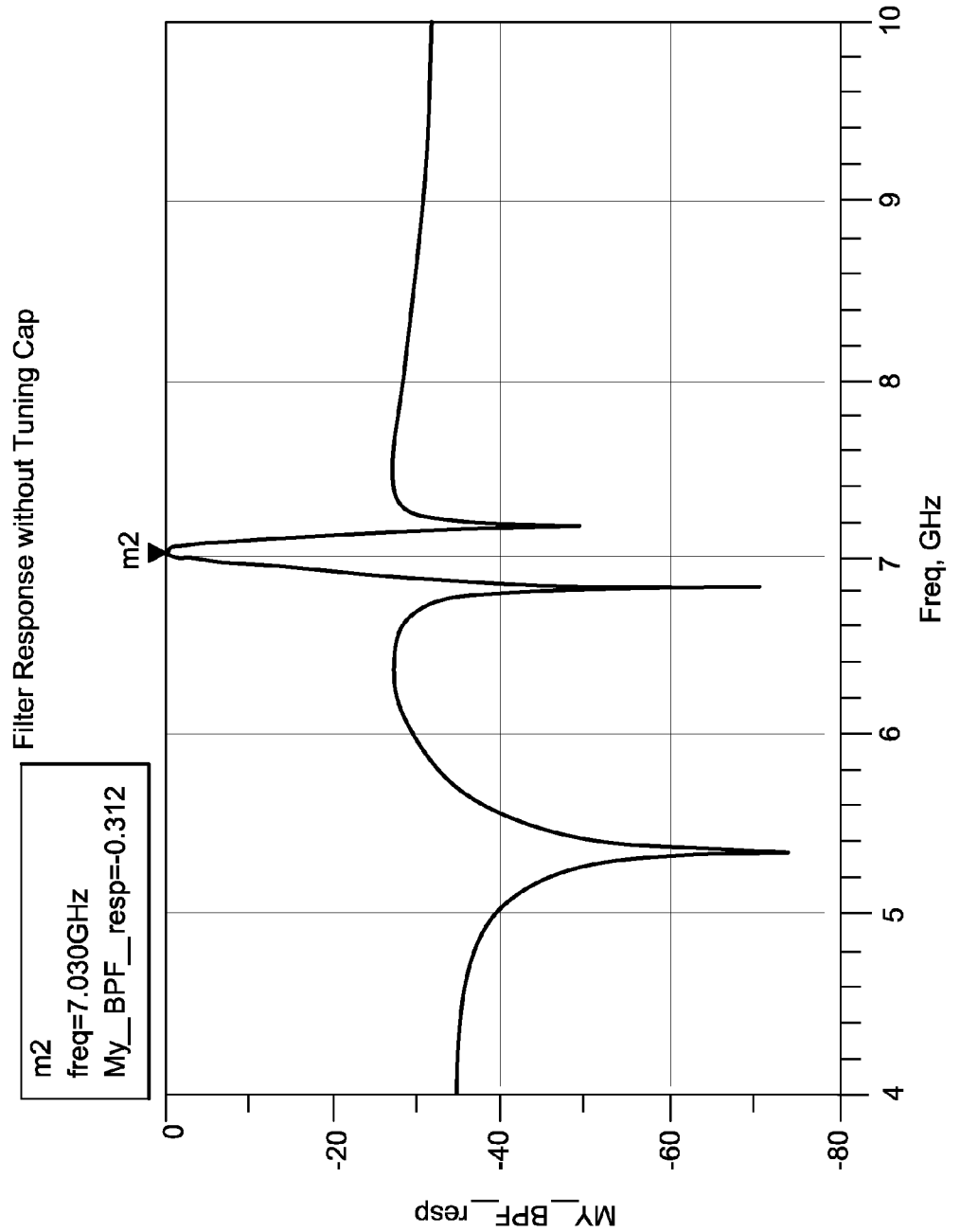
FIG. 2 is a frequency response of the filter.

FIG. 2 shows the frequency response of the filter of FIGS. 1A, 1B and 1C without the use of the variable tuning capacitors 150, 151. Here it is seen that sidelobe performance of approximately −27 DB is achieved at a frequency of 7.030 GHz.

Figure 3:
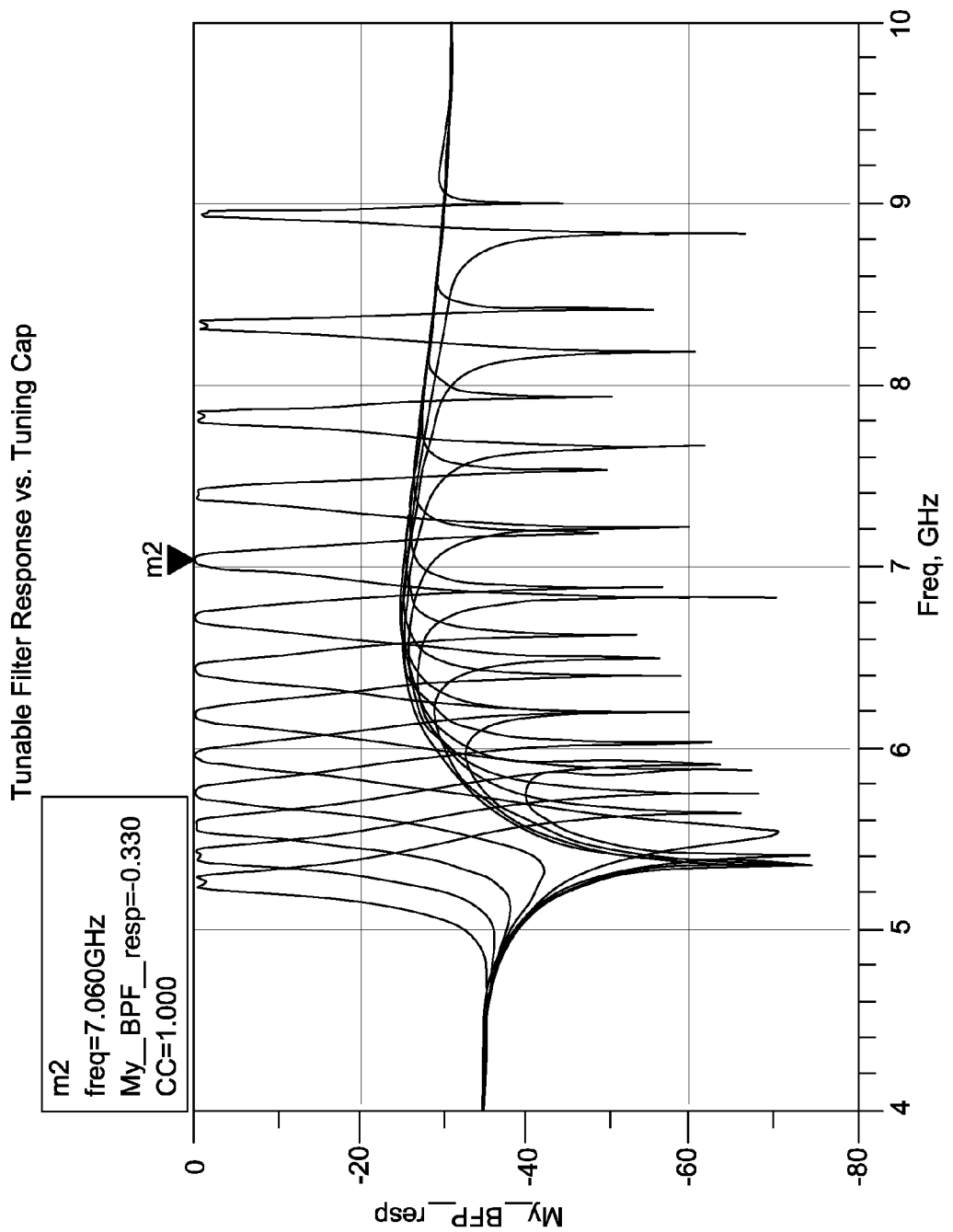
FIG. 3 shows the tunability of the filter for varying values of shunt capacitance.

However, when the variable tuning capacitors 150, 151 are added, the response in FIG. 3 is now achieved. This revised response seen to be tunable over a range of frequencies from approximately 5.2 GHz to 9 GHz with accordingly relatively low sidelobe levels of about 25 dB.

Figure 4:
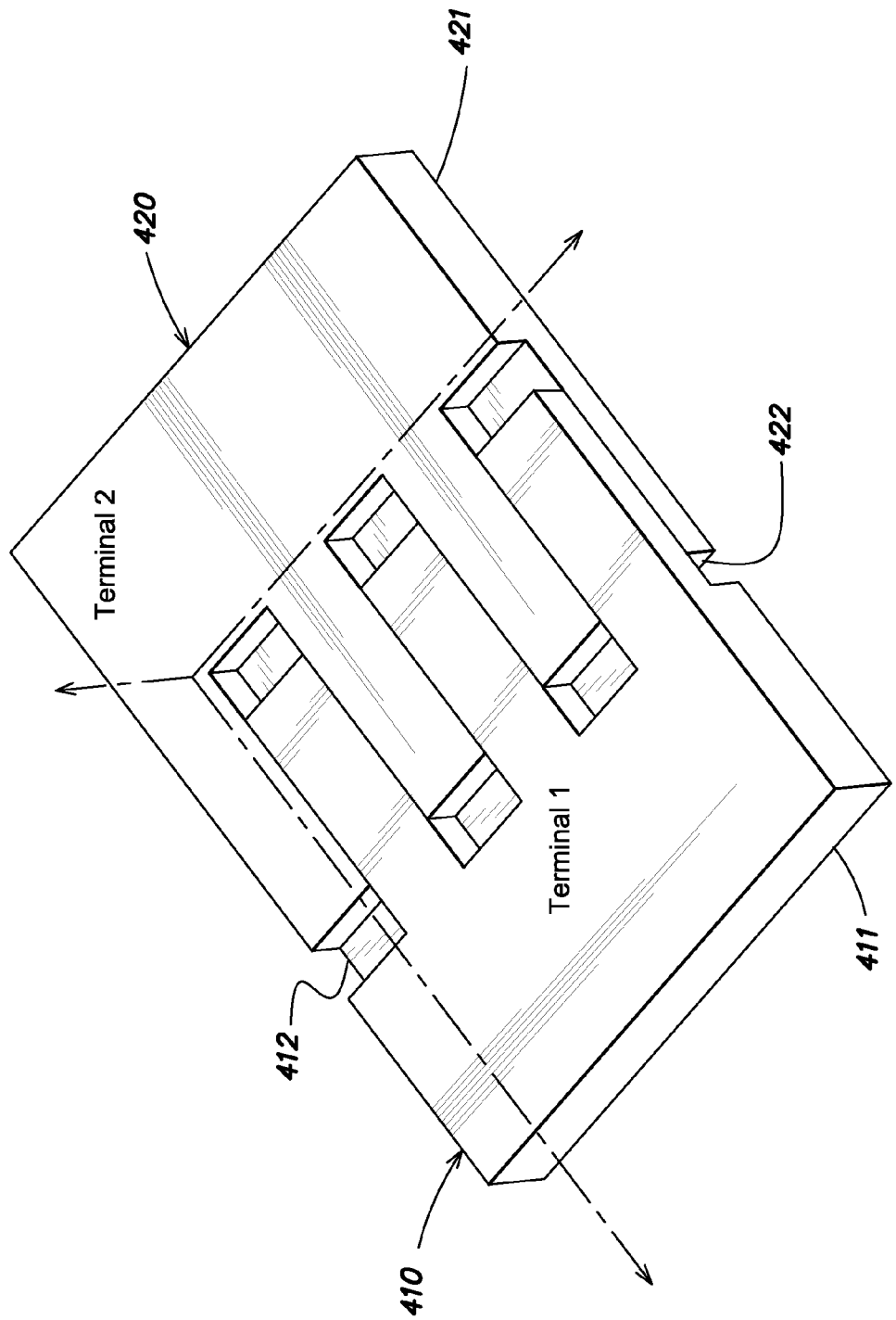
FIG. 4 is a more detailed three-dimensional view of the structure of one possible implementation of the shunt capacitor.

FIG. 4 illustrates one possible embodiment of the variable shunt capacitor in more detail. In this particular arrangement, a first terminal 400 consists of a main body section 401 and a number of extending fingers 402. Similarly a second terminal 420 consists of a main body portion 421 and a similar number of extending fingers 422. The fingers are generally rectangular in cross-section and each finger extends a predetermined distance away from its respective body portion. The fingers 402, 422 on each body are arranged in a two-dimensional array such that there are at least two rows of fingers extending from the main body of each terminal.

Changing the spacing between the rows and columns will also alter the capacitance; spacing the fingers closer together will decrease the capacitance while separating them will increase capacitance. In the illustrated embodiment, the overall capacitance of the interdigitated capacitor is controlled by adjusting the spacing between the first and second terminals. The spacing may be controlled by a piezo electric, micromechanical or other actuator. However in other implementations, the two body portions are disposed in any other way such that the distance between them, or a relative permittivity of a dielectric material disposed between them, may be adjusted.

Figure 5:
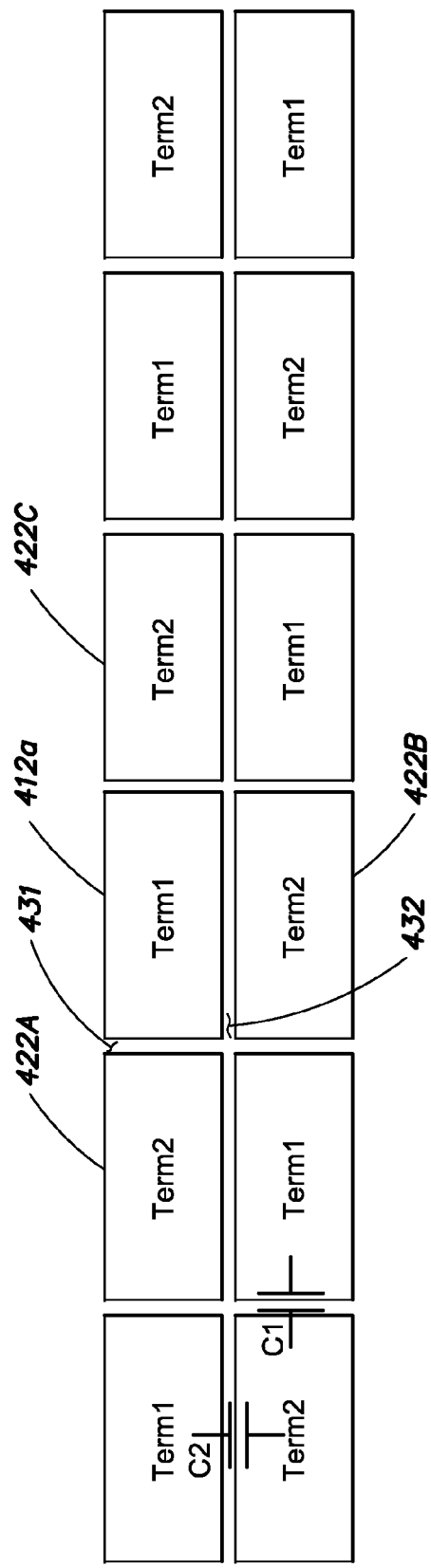
FIG. 5 is a cross-sectional view of the shunt capacitor of FIG. 4.

FIG. 5 is a cross-sectional view of the shunt capacitor showing finger-arrays in more detail. There are two rows of fingers in this example, with the fingers in each row alternatively connected to the first terminal or the second terminal. Spacing is maintained between fingers of terminal one and terminal two in both a horizontal and vertical direction. For example, finger 412-$a$ of terminal one is placed uniform distance away from adjacent neighboring fingers 422-$a$, 422-$b$, and 422-$c$. A gap thus exists between finger 412-$a$ and its nearest neighbor fingers 422-$a$, 422-$b$ and 422-$c$. Capacitance is thus provided by the vertical gaps 431 between terminal one and its nearest neighbors 422-$a$ and 422-$c$ in the same row, and also by the gap 433 between terminal 412-$a$ and its neighbor 422-$b$ in the row immediately below. Capacitance is thus provided in both the vertical and lateral direction. This increases the capacitive density for a given amount of space, and also increases the self resonance frequency (SRF) and quality factor (Q).

While FIG. 4 and FIG. 5 illustrate an interdigitated capacitor structure having two rows and six columns, it should be understood that other numbers of rows and columns are possible to provide different ranges of capacitance.

Figure 6:
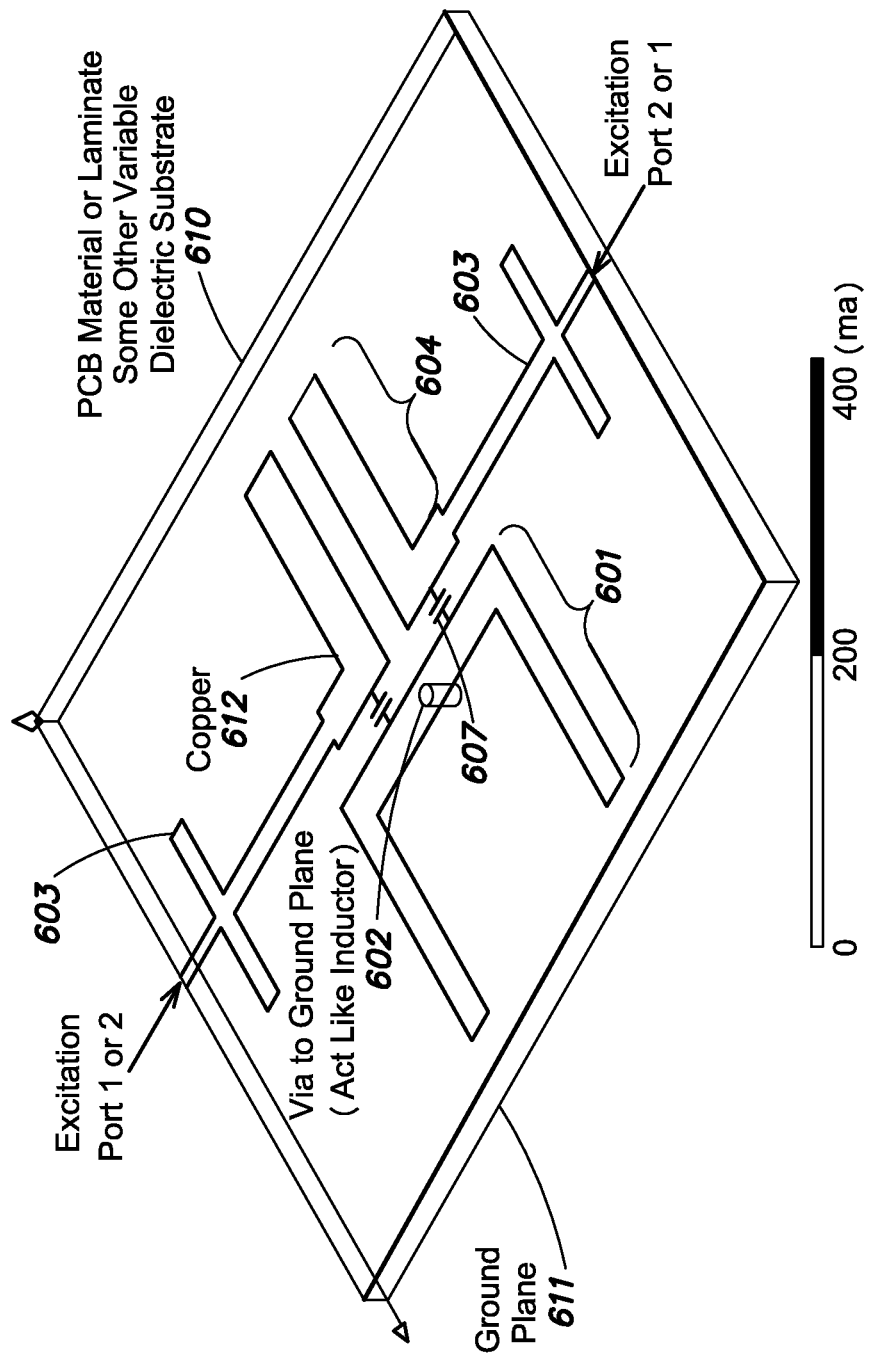
FIG. 6 is an example printed circuit board implementation of some of the components.

FIG. 6 illustrates different types of transmission line sections in more detail. Here is seen that a PCB material, laminate, or some other sort of dielectric material substrate 610 is provided with or on a ground plane 611. At least one layer 610 of the substrate is formed of a dielectric.

Conductive sections such as formed of copper 612 are placed on the top layer.

A first conductive trace 601 may be one or more straight or meandering line conductors with a via 602 through to the PCB material 610 to the ground plane 611. This straight section with via 602 acts primarily as an inductor. Along with the coupling capacitor(s) 607 between parallel traces, this forms an LCLCL network (see e.g., element 111 of FIG. 1).

Another element 604 is constructed as two conductive traces with a gap between them, and thus implements a capacitive section with capacitor value being a function of the spacing between the lines (e.g., element 120 of FIG. 1).

Other transmission line sections such as section 603 implement a junction and act as a capacitor element (e.g., element 140 of FIG. 1).

In addition, while the individual fingers in the illustrated arrangement have a defined cross-sectional shape that fits between corresponding fingers of the other terminal, the exact the shape of each finger may vary. For example, the fingers may be rectangular, trapezoidal, circular, or some other regular geometric shape. A dielectric insulator may be disposed on one or both of the finger arrays.

Figure 7:
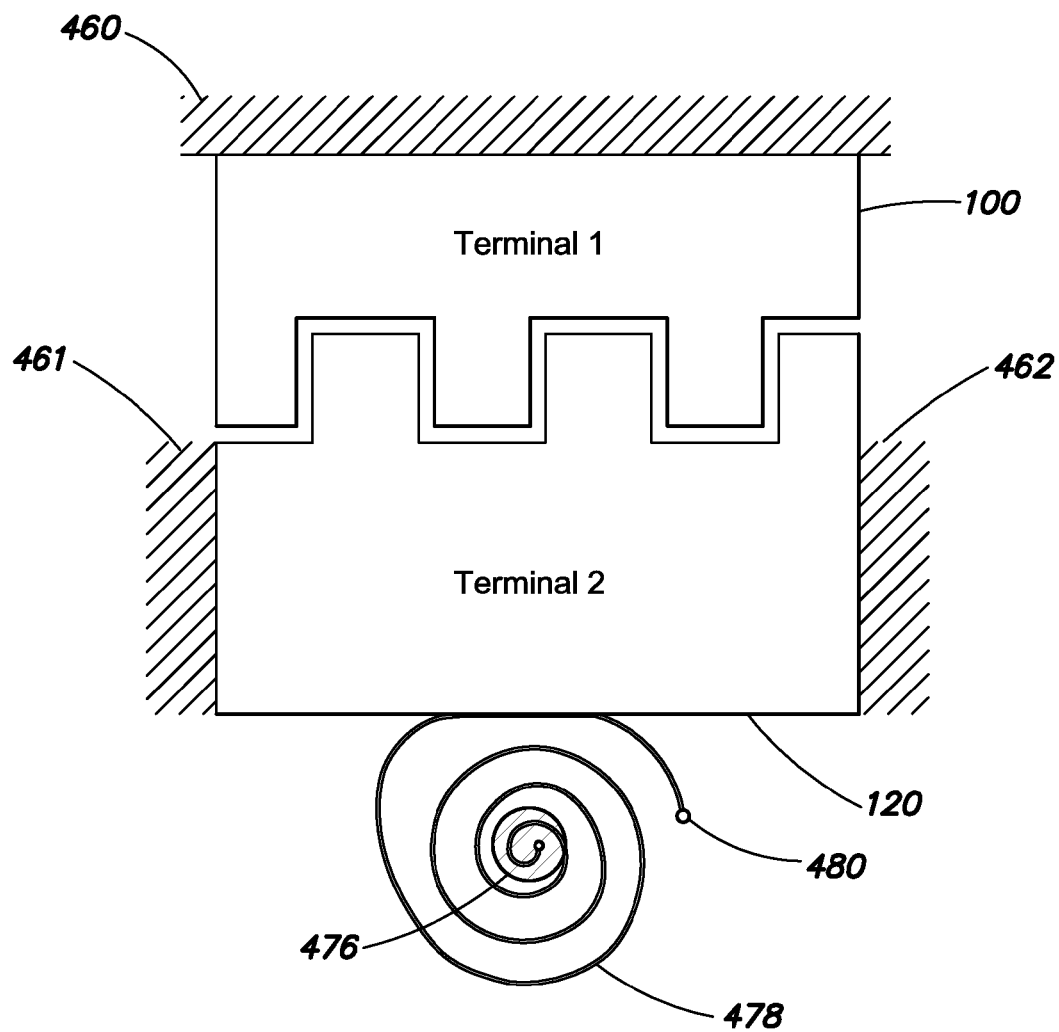
FIG. 7 shows further detail of one possible arrangement for tuning the shunt capacitor.

The capacitance of the interdigitated structure may also be adjusted in a couple of ways. In a first approach, capacitance is varied by adjusting a relative spacing between the fingers of the first and second terminal sections. This movement between terminal sections may be obtained via piezoelectric actuator(s), with spring(s), mechanical lever(s), or in other ways. One possible such implementation is shown in FIG. 7, where the the first terminal 100 is fixed to a base 460, and the second terminal 120 is movable along an axis between two guided walls 461, 462. A piezoelectric controlled motor 476 controls tension on a spring 478 fixed to point 480. Thus, when the motor 476 is activated to tighten the spring 478, the distance between terminal 100 and 120 is increased; when the spring 478 is loosened, the distance between terminals 100 and 120 decreases.

It should also be understood that in other embodiments, the capacitance can be varied if the material used to implement one or more insulator(s) disposed between the fingers is sensitive to an applied voltage. In those embodiments, the capacitance can be altered by changing the voltage applied to the insulator(s).

More detailed examples of the types of tunable interdigitated capacitors that may be utilized are shown in the above-referenced U.S. Patent Application entitled "Tunable Interdigitated Capacitor" filed Apr. 4, 2014.

It should also be understood that although a specific bandpass filter was shown in the above description, that other types of filters (low pass, high pass, notch filters, etc.) may be implemented using the principles discussed herein.

What is claimed is:

1. A tunable filter apparatus comprising:
   at least one fixed capacitive element including a first transmission line section disposed adjacent a first dielectric material section having a dielectric constant;
   at least one fixed inductive element including a second transmission line section disposed adjacent a second dielectric material section having a dielectric constant; and
   at least one interdigitated capacitive element including at least a first main body and two or more fingers extending from the first main body, the two or more fingers configured as an array having at least two rows and at least two columns.

2. The apparatus of claim 1 wherein the interdigitated capacitive element is adjustable.

3. The apparatus of claim 1 wherein the interdigitated capacitive element further comprises
   a second terminal section comprising a second main body and two or more fingers extending from the second main body; and
   the fingers of the first and second terminal sections interposed between one another.

4. The apparatus of claim 3 wherein the fingers of the first and second terminal sections are generally rectangular in cross section.

5. The apparatus of claim 4 wherein the first and second terminal sections are disposed with respect to one another to provide uniform spacing between vertical and lateral side surfaces of the fingers.

6. The apparatus of claim 5 additionally comprising a controller connected to effect a change in impedance of the capacitor by moving the fingers of the first and second terminal sections with respect to one another.

7. The apparatus of claim 1 wherein a dielectric constant of at least one of the first or second dielectric material section is variable.

8. The apparatus of claim 7 wherein the dielectric constant of at least one of the first or second dielectric material varies in response to an applied voltage.

* * * * *